United States Patent [19]
Lewison

[11] Patent Number: 5,901,176
[45] Date of Patent: May 4, 1999

[54] DELTA-SIGMA PULSE WIDTH MODULATOR CONTROL CIRCUIT

[75] Inventor: Richard S. Lewison, Corvallis, Oreg.

[73] Assignee: Hewlett-Packard Company, Palo Alto, Calif.

[21] Appl. No.: 08/951,888

[22] Filed: Oct. 16, 1997

Related U.S. Application Data

[63] Continuation-in-part of application No. 08/846,610, Apr. 29, 1997.

[51] Int. Cl.$^6$ ....................................................... H03K 7/08
[52] U.S. Cl. ............................................. 375/238; 332/109
[58] Field of Search ................................... 375/238, 247; 370/212; 332/109

[56] References Cited

U.S. PATENT DOCUMENTS

| | | | |
|---|---|---|---|
| 4,685,114 | 8/1987 | Welling | 375/238 |
| 5,055,708 | 10/1991 | Sugawara | 327/110 |
| 5,055,802 | 10/1991 | Hietala et al. | 331/16 |
| 5,150,324 | 9/1992 | Takasuka et al. | 364/807 |
| 5,245,345 | 9/1993 | Kohdaka et al. | 341/152 |
| 5,534,827 | 7/1996 | Yamaji | 332/103 |
| 5,539,403 | 7/1996 | Tani et al. | 341/144 |
| 5,677,618 | 10/1997 | Fiez et al. | 323/282 |
| 5,768,316 | 6/1998 | Sogo | 375/260 |

OTHER PUBLICATIONS

Lancaster, "The Quest for Magic Sine Waves", Circuit Cellular INK, Issue #59, Jun. 1995, pp. 28–35.

Magrath et al., "Power Digital–to–Analogue Conversion Using a Sigma–Delta Modulator with Controlled Limit Cycles", Electronic Letters, vol. 31, No. 4, Feb. 16, 1995, pp. 251–253.

Cooley et al., "PWM and PCM Techniques for Control of Digitally Programmable Switching Power Supplies", IEEE ISBN No. 0–7803–2570–2/95, pp. 1114–1117.

*Primary Examiner*—Young T. Tse

[57] ABSTRACT

A delta sigma pulse width modulator control circuit uses a delta sigma modulator as a first stage to create a sequence of pulses representing an input control signal. A pulse width modulator weighs each pulse, accumulates the sequence of weighted pulses and defines a pulse width modulated output signal from the accumulated pulses. The pulse width modulated signal is given a randomly generated offset to the time of pulse value transition and an adjacent pulse value matching technique is used to reduce harmonically related noise generation.

16 Claims, 10 Drawing Sheets

DELTA-SIGMA PULSE WIDTH MODULATOR CONTROL CIRCUIT

CROSS REFERENCE TO CO-PENDING APPLICATION

This application is a continuation in part of U.S. patent application Ser. No. 08/846,610, filed on Apr. 29, 1997 and assigned to the same assignee as the present application.

BACKGROUND OF THE INVENTION

The present invention generally relates to an electronic circuit that controls a signal coupled to a load. It more particularly relates to a digital pulse width modulator using a delta sigma modulator as an input stage to control a drive signal to a load.

Industry has long used pulse width modulators (PWM) to supply and control drive to motors, direct-current to alternating-current conversion, power supply regulators, and many other power loads. As is well known, the duty cycle of a square wave may be varied or integrated to create a desired magnitude of an output alternating-current signal. Due to the non-zero switching time in power switching devices, the number of digital transitions per unit time typically determines the thermal power dissipation of systems using these devices. PWM circuits have a fixed number of transitions per unit time.

Traditional PWM applications use a triangle or sawtooth reference waveform to compare against an incoming analog signal (which may, among other things, be an adjustment signal or a feedback signal or both). The digital result of this comparison is a PWM output. Generally, the generation of such an analog triangle or sawtooth reference waveform has been accomplished using precision capacitors, resistors, and current sources as a charge/discharge ramp up/down circuit. While this implementation is not a problem for discrete realizations, implementing such components in an integrated circuit results in components that are hard to control. The components may exhibit non-linear behavior, especially if the integrated circuit technology is optimized for digital operation.

PWM technology is relatively simple, producing a PWM output signal that closely approximates the input signal (within the frequency band of interest), and has a fixed number of digital transitions per unit time. Unfortunately, the fixed frequency nature of traditional PWM technology results in a significant amount of spurious harmonic noise signals which can result in significant electromagnetic interference to other electronic circuits.

Overcoming the problem of harmonic noise has been addressed before, with most methods spreading the harmonic noise by dithering the PWM fundamental frequency or introducing extra transitions in the PWM waveform to tailor the spectrum. This spectrum tailoring, however, does not retain the PWM feature of a fixed number of digital transitions per unit time, which is important for some applications.

Delta sigma modulation (DSM) has been used extensively in analog-to-digital and digital-to-analog conversion, and inputs are typically sampled at a frequency several times higher than the input signal frequency. (Delta sigma modulation is occasionally referred to as sigma delta modulation. The terms are considered interchangeable herein). DSM has the advantage of allowing the shaping of quantization noise in such a way as to significantly reduce the quantization noise at low frequencies relative to the frequency of the switching clock. The output from a DSM circuit is a stream of digital pulses. An average of these digital output pulses over a finite period can be used to represent the input signal, if the averaging period chosen is at least half of the period of the input signal. An additional advantage of DSM technology is that DSM circuits can be built using standard digital CMOS processes for integrated circuits. This is because DSM circuits are usually implemented as switch capacitor circuits which rely on precise capacitor matching rather than absolute capacitor values. A disadvantage of DSM circuits is that the clock frequency employed can be 100 times the frequency of the input signal. This high oversampling of the input signal can be reduced by using alternative approaches by selecting the proper DSM and averaging technique. The high frequency DSM clock results in many more transitions per second, than traditional PWM. Operating a DSM at lower clock frequencies results in more quantization noise in the frequency band of interest, which interferes with resolution of the signal. This increased quantization noise and increased number of transitions per second has not encouraged the use of DSM when a PWM technology has been available.

Thus, in order to overcome the problems associated with the harmonic noise generation and the need for triangle or sawtooth analog signal generation, a unique combination of PWM and DSM technologies has been created.

SUMMARY OF THE INVENTION

A control circuit which controls power delivered to a load with reduced spurious electromagnetic energy generation employs a delta sigma modulator, which accepts a first signal and generates a second signal representing the first signal with a plurality of digital pulses. A pulse width modulator, including a pulse counter which weights pulses before accumulating them, a low pass filter, and a waveform generator, is coupled to the delta sigma modulator and creates the second signal over a first time period. The pulse width modulator generates a third signal for coupling to the load. The third signal has a first magnitude value, the first magnitude value lasting for a second time period.

DETAILED DESCRIPTION OF A PREFERRED EMBODIMENT

The invention disclosed herein is of a delta-sigma pulse-width modulator (DSPWM), an analog to a PWM digital converter, which reduces the generation of harmonic noise and is suited for implementation in digital integrated circuit technologies.

Figure 1:
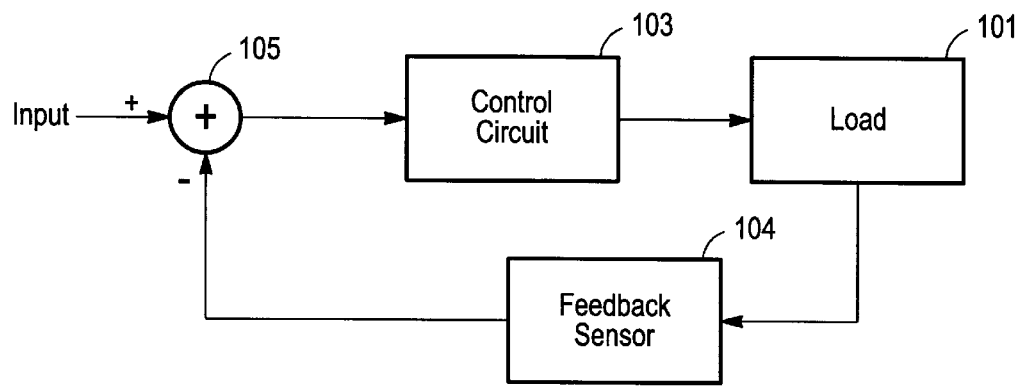
FIG. 1 is a simplified block diagram of a load control circuit.

Referring first to FIG. 1, it can be seen that the simplest application of the present invention is in the control of power supplied to a load 101 by a control circuit 103. An operating parameter is sampled from the load 101 by feedback sensor 104 and fed back through the control circuit 103 for further control of the operating parameter. Such a feedback signal may be combined in the combination circuit 105 with an adjust signal which may modify the operating parameter of the load with an external adjustment. In a preferred embodiment, the load 101 is a conventional DC motor in which an operating parameter is to be controlled and adjusted by the control circuit 103. Such an arrangement can be considered a servomotor.

Figure 2:
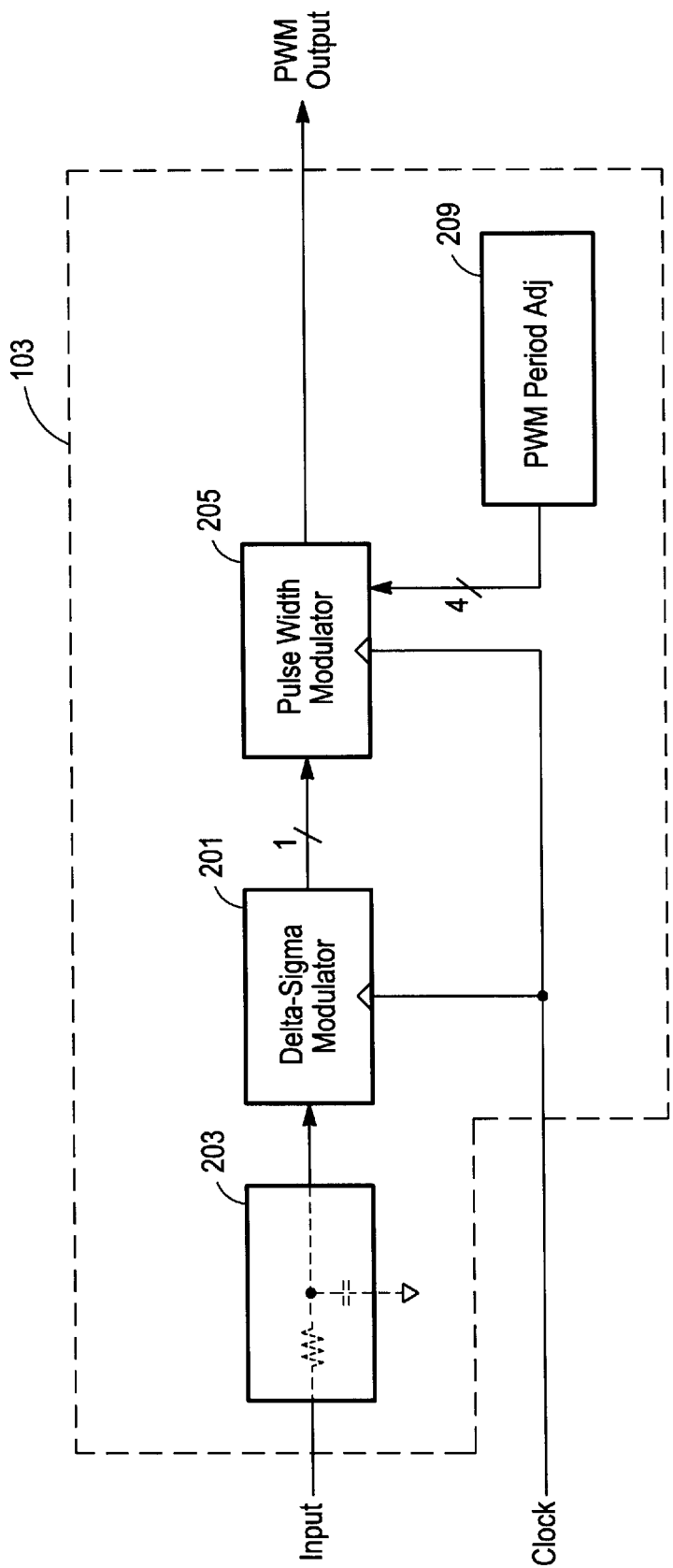
FIG. 2 is a high-level block diagram of a delta sigma pulse width modulator that may employ the present invention.

FIG. 2 illustrates a Delta Sigma Pulse Width Modulator (DSPWM) at the highest level of block diagram. A signal input to the control circuit 103 is coupled to a delta sigma modulator 201 by way of an optional input low pass filter 203 which, in the preferred embodiment, has a cut-off frequency of one half the selected PWM period (to prevent signal aliasing) and a DSM clock frequency of 20 MHz. Signals above this cutoff frequency are not allowed to be coupled to the DSM 201 since they are likely to degrade the DSM operation. The DSM 201 is followed by a pulse width modulator 205 which accumulates the plurality of pulses constituting the DSM 201 output signal over a predefined period of time (the PWM period) and converts it to an effective pulse width modulated output pulse for application to the load 101. In an integrated circuit implementation, the low pass filter 203 is usually located external to the integrated circuit (IC) chip. The low pass filter 203 can be constructed with a slow roll-off if a digital low pass filter is added, after the accumulator in the pulse width modulator, to reject out of interest band signals from the input signal. This approach negates the need to have a complicated external filter or an analog based switch capacitor filter on the IC chip. It also provides a method by which the high frequency roll-off inherent in the accumulator can be corrected. A clock signal is applied to both the delta sigma modulator 201 and the pulse width modulator 205 for proper synchronization of the circuit. In the preferred embodiment, the clock frequency is 20 MHz, which is much higher than the desired PWM frequency. A PWM period adjust circuit 209 is coupled to the pulse width modulator 205 by a 4 bit bus and selects the pulse PWM frequency by inputting a 4 bit binary code to the pulse width modulator. In the preferred embodiment, with a clock frequency of 20 MHz, the PWM frequency can be adjusted from 156.25 kHz to 9.7656 kHz. While not apparent in the block diagram of FIG. 2, the pulse width modulator 205 further provides pulse dithering and combination to reduce spurious harmonic noise generation.

Figure 3:
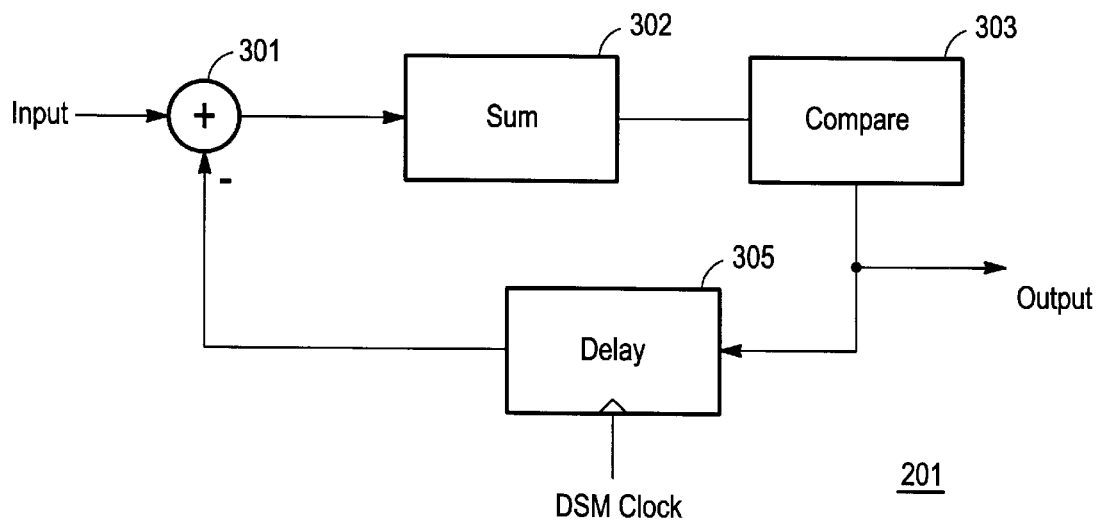
FIG. 3 is a generalized diagram of a delta sigma modulator that may be employed in the present invention.

The delta sigma modulator 201 utilizes the generalized block diagram of FIG. 3 in which the input signal is combined with the feedback signal in an adder 301, applied to a integrator which is then applied to a comparator 303, and fed back to the adder 301 by way of delay (register) 305 and output from the delta sigma modulator 201. Although the preferred embodiment's DSM employs a first order DSM, there may be applications where a second order or even a third order cascaded modulator is required to achieve the resolution needed. If resolution is not a determining factor, the first order modulator has the advantage of being less complicated to implement. Additionally, it intrinsically has more error noise in the signal band, which for a busy input signal helps to dither the PWM signal to further reduce EMI. For non-busy inputs, first order modulators may cause limit cycles. An advantage of the higher order modulators is a reduction in the probability of limit cycles. Limit cycles cause harmonics of the input signal to be produced in the error band, which than can be aliased into the signal band during the averaging stage (accumulation) in the pulse width modulator. Other design decisions determine what DSM should be used for a given application. These additional tradeoffs include the desire for lower oversampling rates, faster PWM frequencies, desire for less jitter in signal, and minimal latency through the DSPWM (faster response time). Those skilled in the art will appreciate that any DSM modulator of varying construction and order could be used and still fall within the spirit and scope of the invention.

Figure 4:
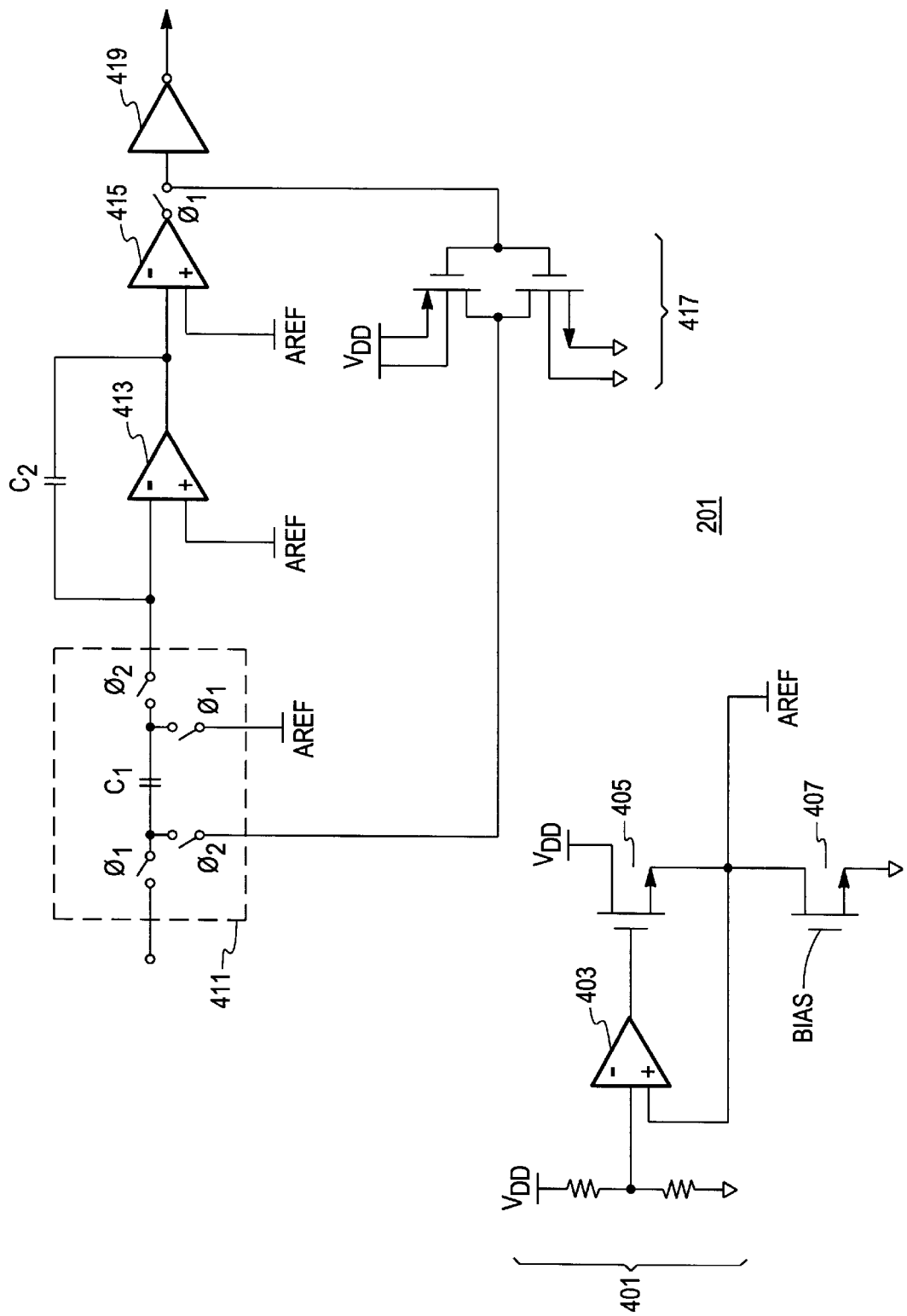
FIG. 4 is a schematic diagram of a delta sigma modulator that may be employed in the present invention.

A detailed schematic of the delta sigma modulator 201 employed in the preferred embodiment is shown in FIG. 4. An analog ground reference AREF is generated in conventional fashion from a voltage divider 401 connected between analog supply voltage, VDD, and ground such that the voltage between AREF and ground equals VDD/2 in the preferred embodiment. The output from the voltage divider 401 is coupled through an operational amplifier 403, connected in conventional fashion, to output drive transistors 405 and 407. A bias voltage is applied to the gate of transistor 407 such that, in the preferred embodiment, when the analog voltage VDD is equal to 3.3 volts, an analog ground reference, AREF, of 1.65 volts is developed.

The input signal is coupled to a conventional switch capacitor structure 411 consisting of a capacitor C1 and four solid state switches driven by two non-overlapping shifted clock signals at 20 MHz, $\phi_1$, and $\phi_2$ in the preferred embodiment. The output from the switch capacitor filter structure 411 is connected to the inverting input of operational amplifier 413 along with integration capacitor C2 (421) which is connected between the inverting input and output of operational amplifier 413. The switch capacitor filter structure 411 is referenced to AREF. The output of the operational amplifier 413 is connected to the inverting input of comparator 415 and is referenced to AREF. The output of comparator 415 is sampled with $\phi_1$ using a solid state switch and the latched result of the comparison is buffered by inverter 419 and becomes the digital output. The latched result is also fedback to the input by way of a 1-bit digital/analog converter consisting of amplifier 417 and is connected to the $\phi_2$ leg of switched capacitor structure 411.

Figure 5A:
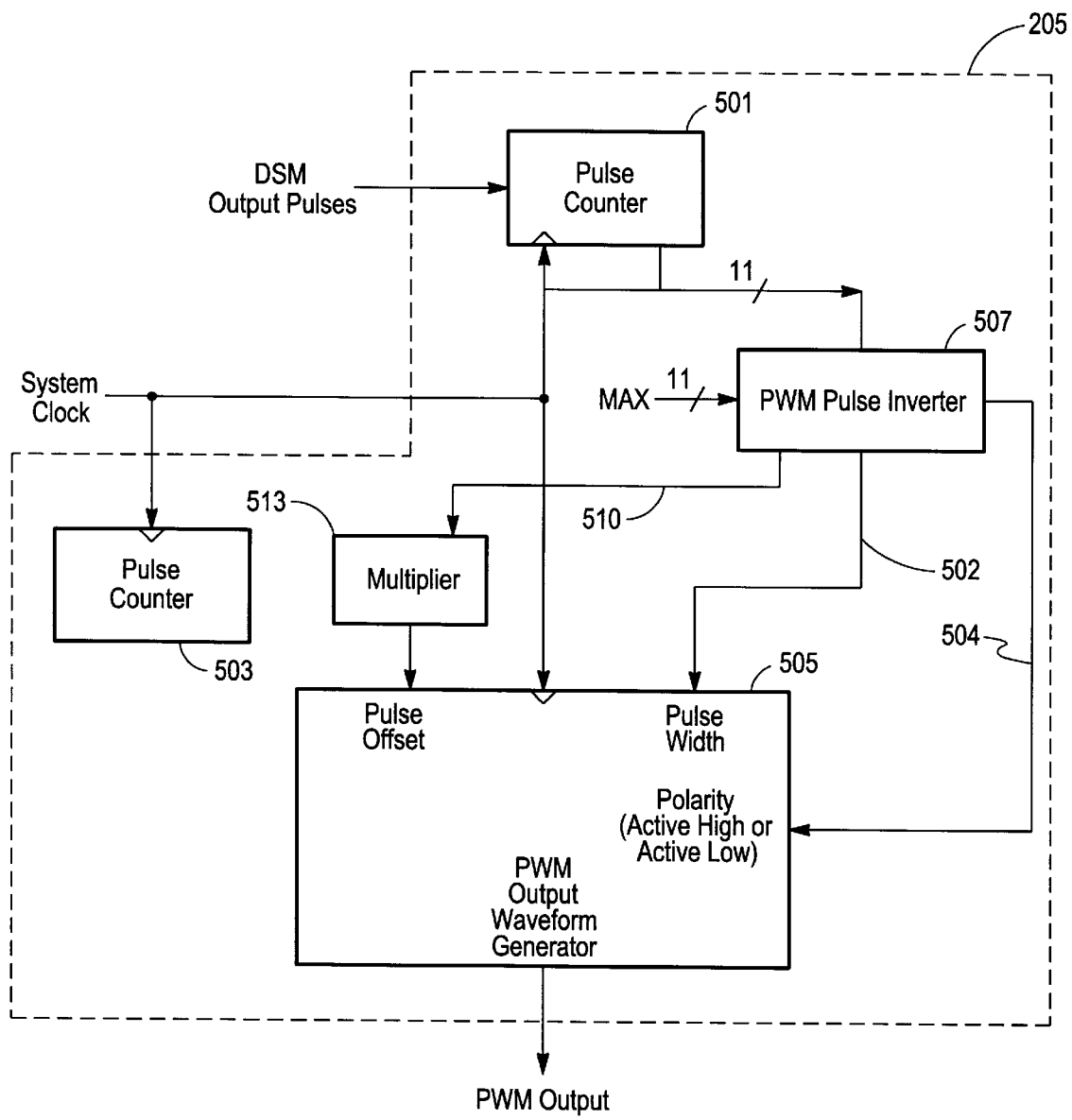
FIG. 5A is a block diagram of a pulse width modulator that is employed in the preferred embodiment.

The output from the delta sigma modulator 201 is coupled to the pulse width modulator 205 to define the uncorrected pulse width of the PWM signal output to the load and an uncorrected maximum pulse offset signal. A simplified block diagram of the pulse width modulator 205 is shown in FIG. 5A. In pulse counter 501, the pulse width modulator 205 accumulates the digital pulses output from the DSM circuit 201 over one PWM period. This accumulation of pulses determines the effective uncorrected duty cycle of the PWM waveform for the next period.

Figure 5B:
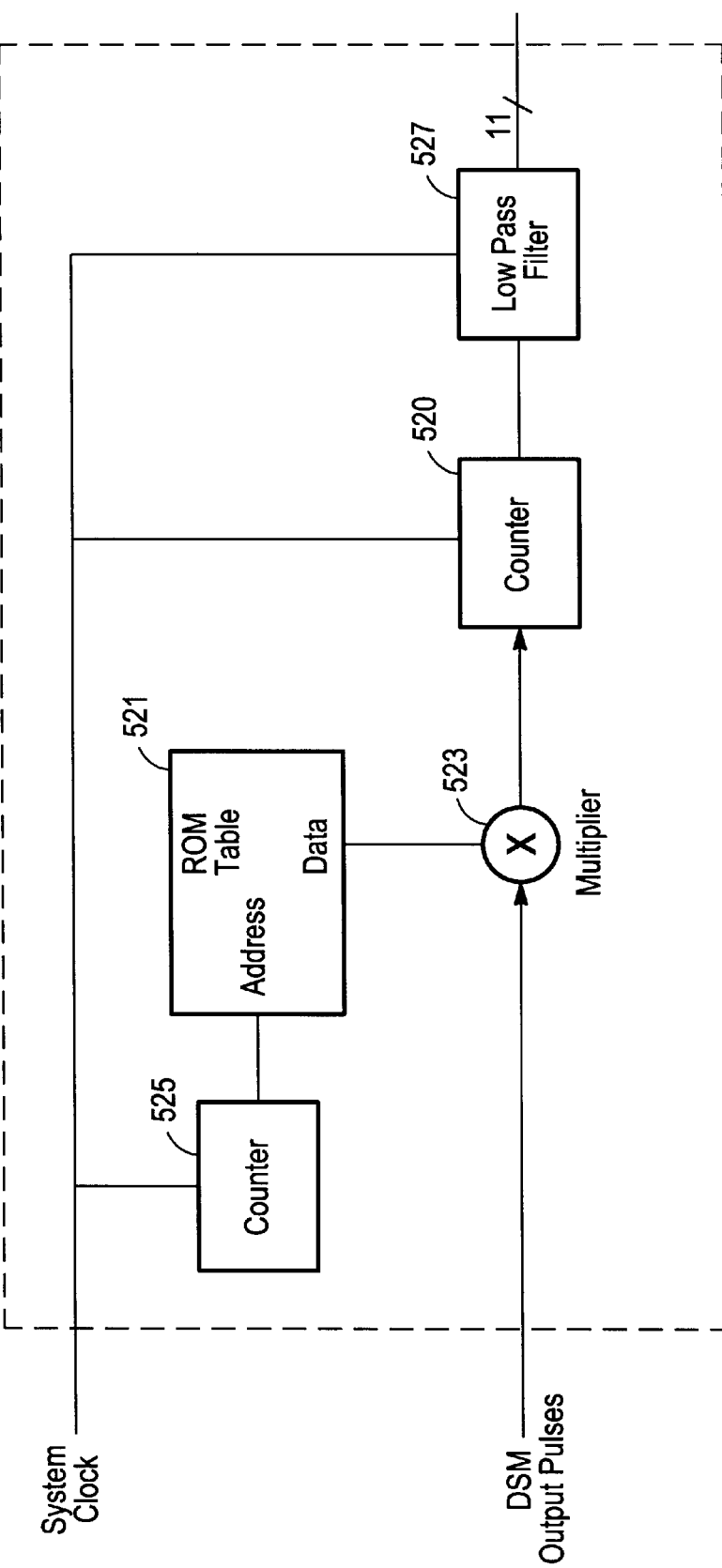
FIG. 5B is a block diagram of the pulse counter that uses a weighted average used in the preferred embodiment.

An alternate embodiment implements the accumulation of pulses using an equal weighting of each sample. In FIG. 5B, the preferred embodiment, different weightings of samples, multiplying each pulse with a separate coefficient (weight) that is based on the pulse's relative position from the commencement of PWM period, before accumulating, can provide filtering of the signal that allows for more resolution in determining the duty cycle of the PWM waveform. The weights are stored as a table in a ROM 521 and are indexed by a counter 525. The DSM output pulses are multiplied by the weights in multiplier 523. The multiplier 523 output is accumulated in the counter 520. Those skilled in the art will appreciate that any accumulation filter could be implemented using other weighting architectures and still fall within the spirit and scope of the invention. Optionally, a digital low pass filter 527 can be used after the counter 520 to filter out any unwanted signal band components that are not desired in the PWM output waveform. The advantage of having the digital low pass filter here is that it is well known how to implement this filter and it removes the necessity of having a complicated pre-filter (before input to DSM) either off the IC or having to implement a pre-filter using switch capacitor filters on the IC.

Once the duty cycle of the next period is corrected by the PWM pulse inverter 507 and applied to line 502, the start of the associated PWM pulse is delayed for a pseudo-randomly determined number of system clock cycles which is determined by the random number generator 503. The pseudo-random number is chosen such that the probability distribution of the offset is evenly distributed between zero and the PWM period minus the corrected pulse width. Normally the PWM output pulse is a high going pulse commencing at the start of the PWM (as illustrated by waveform 601 of FIG. 6) or delayed by a pseudorandom offset 605, generated as previously described. However, when the duty cycle is determined to be over 50% by the PWM pulse inverter 507 and a "1" is applied to line 504, the PWM output from the output waveform generator 505 is transformed under control of the pulse inverter 507. This transformation treats the PWM output signal as an active low rather than an active high and allows the active low portion, pulse 615, of the waveform (which has the shortest duration of time) to be offset within the pulse period by a pseudorandom delay 611, thereby creating a wider distribution in time of the PWM pulse offset for that particular pulse than if the pulse were not transformed.

The pulse width modulator 205 also reduces the number of transitions made during consecutive PWM output signal periods. This is accomplished in the preferred embodiment by delaying pulse transitions at the boundary of each PWM period, as illustrated by waveform 613, by zeroing the offset delay of the PWM output pulse during a PWM period for which the transformation from an active low pulse protocol occurs from the previous period to an active high pulse protocol. If consecutive PWM periods utilize identical pulse protocols (active high to active high or active low to active low), this zeroing is not activated. This alleviates extraneous transitions such as the one on waveform 603 at the boundary between period 2 and period 3.

While not perceivable from FIG. 5A, it can be seen that a register 713 and inverter 710 and NAND 708 (shown in FIG. 7A and 7B) detect a transition from an active low pulse to an active high pulse from one PWM period to the next. This detection deactivates the register 723 via OR gate 741, thereby creating an effective zero as an output from the pseudorandom number generator 503, thereby forcing a pulse offset of zero. Signal 510 output from the pulse inverter 507 represents the maximum corrected pulse offset available for the PWM output pulse and is applied to the multiplier 513. Multiplier 513 effectively scales the corrected maximum pulse offset signal 510 by the pseudorandom number generated by pseudorandom number generator 503. This process results in the final randomized (dithered) PWM pulse offset.

Figure 6:
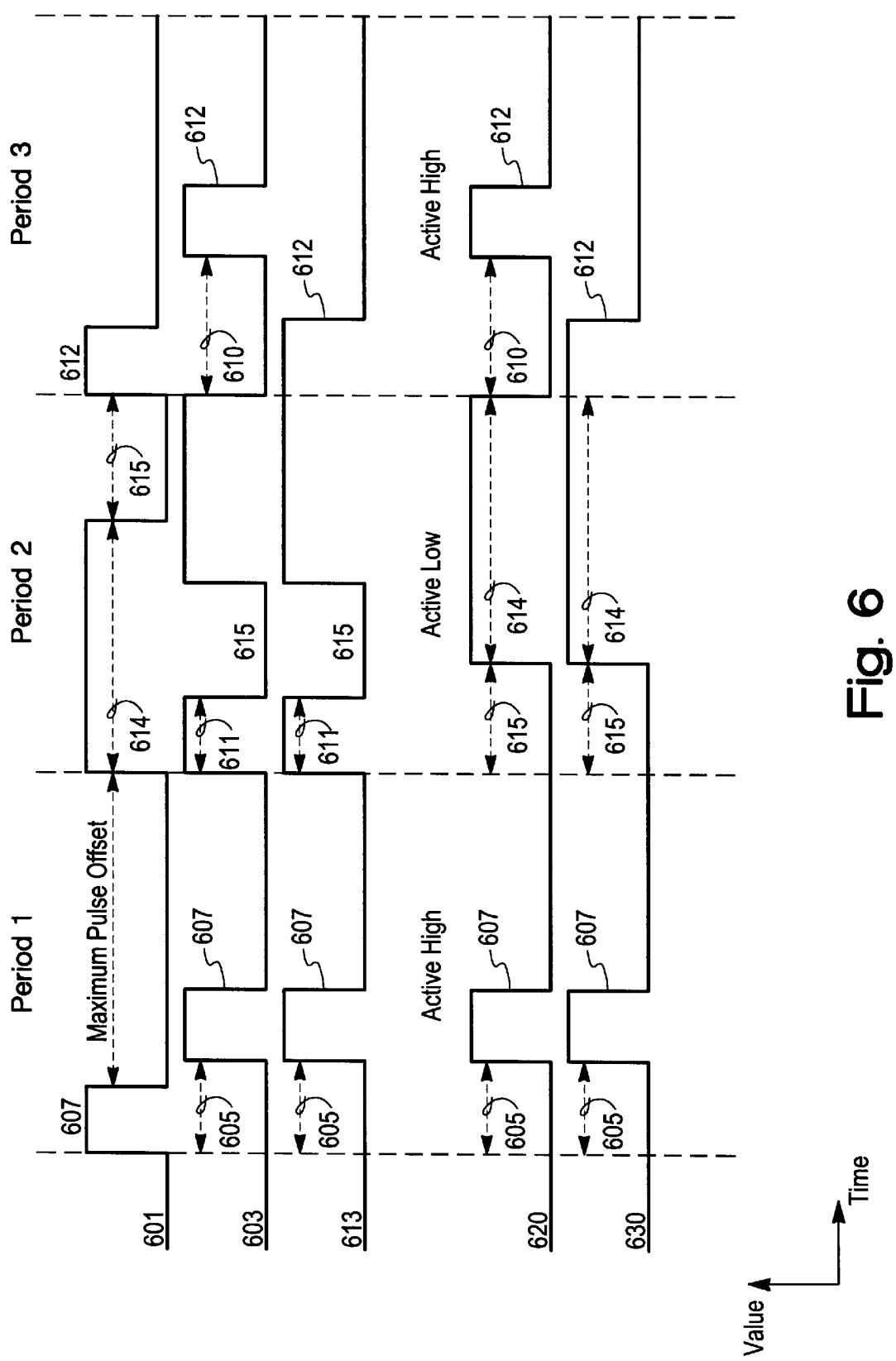
FIG. 6 is a timing diagram of pulse width modulated signals which may represent output signals produced by the preferred embodiment and alternate embodiments of the present invention.

A timing diagram illustrating five possible variations in a PWM output signal is shown in FIG. 6. Three PWM periods, period one, period two and period three, are shown on the time axis of FIG. 6. Waveform 601 is a conventional PWM output signal in which the output duty cycle is 20% for the first pulse period and in which the PWM output signal has a duty cycle of 70% during the second PWM pulse period and which the PWM output signal has a duty cycle of 20% in the third period. Observe that PWM output signal 601 is shown having a transition at the boundary of each PWM period. One feature of the present invention is illustrated in the PWM output waveform 603 in which a random offset 605 has been introduced in the commencement of active high pulse 607 away from the boundary of the commencement of PWM period 1 by the pseudorandom number generator 503 and the PWM output waveform generator 505. The pulse 607 is displaced away from the PWM period 1 commencement boundary by a time equal to a pseudo-random number of 50 nanosecond (20 MHz) system clock pulses in the preferred embodiment. Likewise, the active low pulse 615 during PWM period 2 is treated as a discrete pulse and is randomly shifted away from the PWM period 2 pulse boundary by a pseudorandom offset 611. Random offset 611 is created when the pulse counter 501 indicates a (positive) pulse width greater than 50% to the PWM output generator 505. The output from the pulse counter 501 is inverted (corrected) by PWM pulse inverter 507 to be input as a pulse width defining parameter to the PWM output waveform generator 505. The waveform 613 of FIG. 6 illustrates another feature of the present invention. Positive pulse 607 continues to be offset from the period 1 PWM boundary by random offset 605. Additionally, in period 2, pulse 615 remains displaced by random time 611. In order to keep constant the number of transitions within each period, active high pulse 612 is not placed randomly within the PWM period 3 but is moved to the pulse boundary. Thus, when the PWM output signal during a present PWM period uses an active high pulse protocol following an immediately prior PWM period with a PWM output signal employing an active high protocol or an active low protocol immediately follows an active high protocol, the pulse in the present period is randomly offset from the PWM period boundary by a pseudorandom offset. But when the PWM output signal of the present PWM period uses an active high protocol immediately following a PWM period employing an active low protocol, the active high pulse is aligned at the PWM boundary with the same signal value, thereby keeping number of transitions per cycle constant for the system. This zeroing of the offset occurs whenever the pulse protocol transitions from low to high. This is accomplished in the preferred embodiment by zeroing out the value output from pseudorandom number generator 503.

Waveform 620 shows an alternate embodiment which performs the alignment at the PWM boundary for when the PWM output signal of the present PWM period uses an active low protocol immediately following a PWM period employing an active high protocol. The waveform 620 is equivalent to waveform 613 in that both waveforms preserve the number of transitions per PWM period to be the same as the original waveform 601 transitions. A further reduction in the number of transitions per period is possible if the PWM boundary alignment is performed for both an active high to active low and an active low to active high protocol transition. The result is shown in waveform 630. It can be readily seen from the diagram that there are two less transitions than in waveform 601. For some applications, this feature is a benefit in that it will reduce the power lost in transistor switching and will further reduce spurious EMI emissions. Applications that require a constant number of transitions per cycle can use either waveform 613 or waveform 620's approach. The preferred embodiment has chosen waveform 613.

Figure 7A:
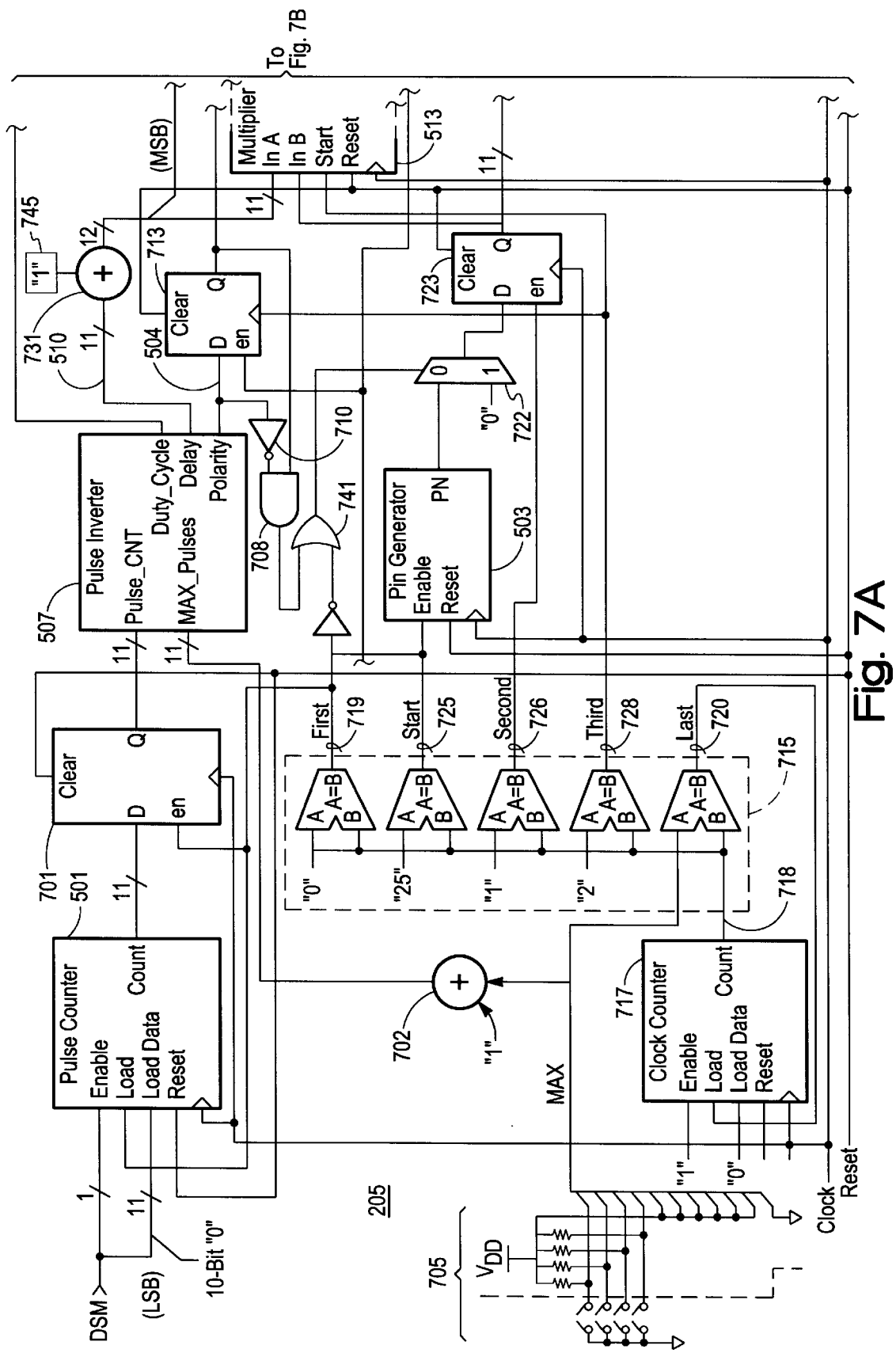
FIGS. 7A and 7B, taken together, are a detailed block diagram of a pulse width modulator circuit which may be employed in the preferred embodiment.
Figure 7B:
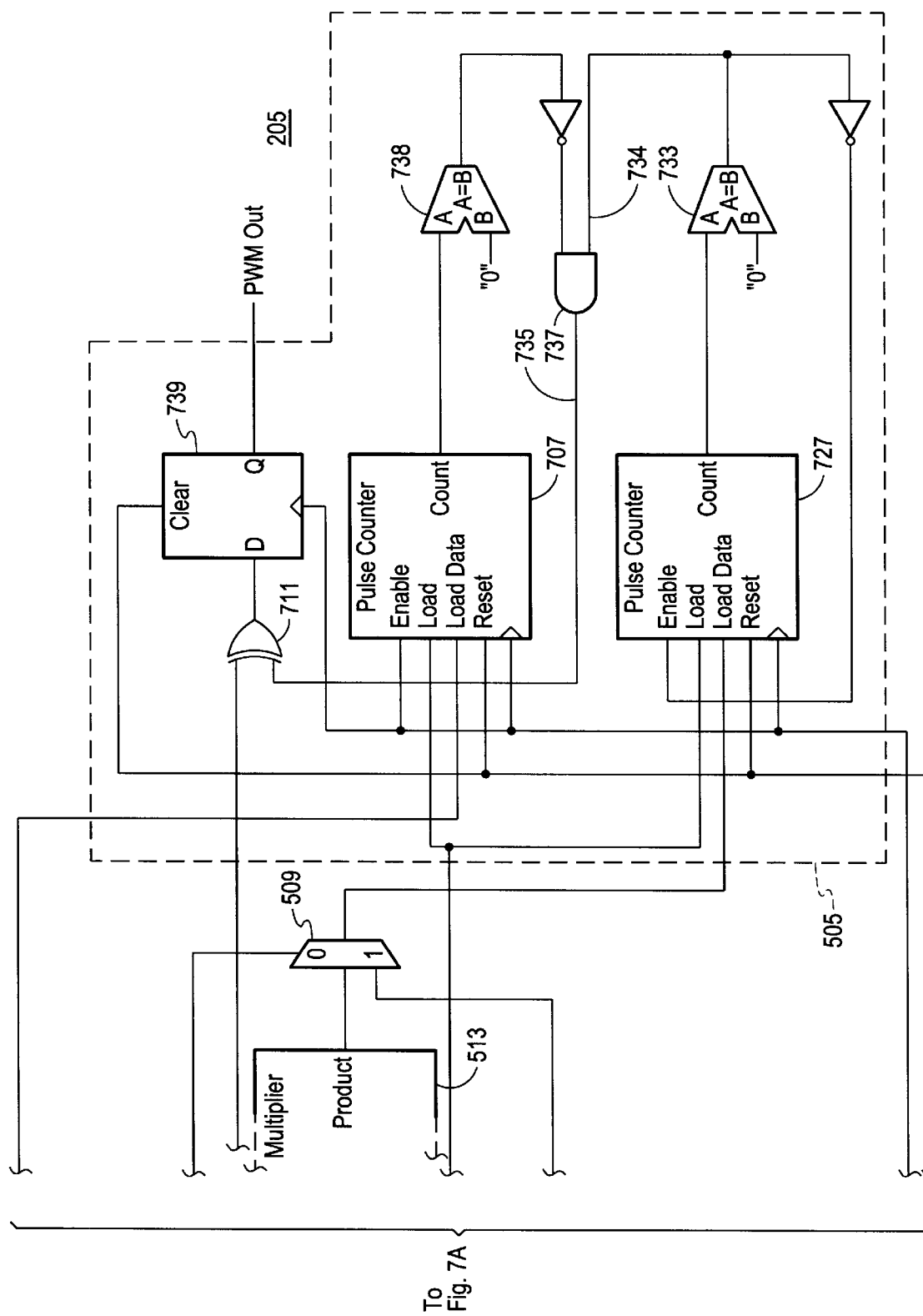

Specifically in the preferred embodiment, and referring to FIGS. 7A and 7B, the output of the pseudorandom number generator 503 is zeroed by the offset disable function. Inverter 710 and NAND 708 and register 713 develop a signal that essentially zeros out the output of pseudorandom number generator 503 for the particular PWM period in process. OR gate 741 couples a clearing signal as though the dithering operation were disabled for that one PWM period by forcing a phase offset for that pulse. The pulses are always inverted (i.e. the pulse protocol is active low) when the duty cycle is greater than 50%, but the offset is set to zero only when there is active low to active high change.

FIGS. 7A and 7B illustrate a detailed block diagram of the pulse width modulator 205. The pulses output from the delta sigma modulator 201 are input to a pulse counter 501 which accumulates the pulses into an 11 bit word to be output to an 11 bit bus which, upon the occurrence of the end of the current PWM period, is coupled through a register 701 to the asynchronous pulse inverter 507. The pulse inverter 507 also accepts an 11 bit wide MAX bus input in which the four most significant bits are predeterminedly selected by jumpers (as indicated by jumper field 705) or by switches or by other means and which utilizes an adder 702 to increment the MAX bus by one to provide a non zero (actual count) input to the pulse inverter. The pulse inverter 507 employs the two 11 bit buses to determine the duty cycle and maximum pulse offset of the next PWM pulse and presents the duty cycle to the duty cycle counter 707. The pulse inverter 507 also presents the maximum pulse offset to the multiplier 513 for pseudorandom scaling, which scaled pulse offset is, in turn, presented to the delay counter 727 (by way of multiplexer 509) and loaded (at the appropriate time) to output a binary duty cycle signal on line 735 which in turn enables the duty cycle counter 707. In order to perform the function of a pulse protocol inverter, the pulse inverter 507 also outputs a pulse polarity (or pulse protocol) signal on line 504 to inverter 710 that outputs to NAND 708 (which functions as an active low pulse to active high pulse protocol change detector in conjunction with register 713) and to exclusive—OR 711 by way of register 713. When the clock counter 717 count at line 718 is equal to the 11 bit MAX bus, the PWM period is deemed ended, the control logic 715 outputs a pulse indicating the end of the PWM period on line 720, and a new PWM pulse period immediately follows. In short, the duty cycle counter 707 keeps track of the PWM duty cycle and clock counter 717 keeps track of the PWM period.

The control logic function 715 is implemented in a distributed logic fashion in the preferred embodiment and is physically arranged in different areas of the integrated circuit. The basic function of the control logic 715 is to generate control signals for the pulse width modulation circuit from the clock counter count on line 718, the PWM period established by the MAX bus, and internally monitored clock counts starting at "0" and continuing through a total clock count equal to the number set on the MAX bus. As illustrated for the preferred embodiment, the number of clock counts are input to a plurality of comparators to generate control signals for the remainder of the pulse width modulation circuit. At the first clock count (clock count "0") the control logic 715 creates a binary "first" pulse applied to line 719 to distinguish the first system clock cycle of the current PWM period. The first pulse is coupled to the "clear" input of pulse counter 501, the "enable" input of register 701, and to multiplexer 722 for removal of offset at pulse protocol change. The control logic 715 also creates a binary "start" signal applied to line 725. The start signal, in the preferred embodiment, occurs at the twenty-fifth clock count and indicates that the multiplier output will be latched at the next clock pulse. The start signal is coupled to the pseudorandom number generator 503 which, in the preferred embodiment, is a conventional linear feedback shift register (LFSR) pseudorandom number generator, to trigger the generation of a new pseudo random number. The start signal is also coupled, as a "load" signal to the duty cycle counter 707 and a delay counter 727. A "second" pulse generated at the count of the second clock count is coupled via line 726 to the enable port of register 723 to allow passage of a generated pseudorandom number. A "third" pulse is coupled to the multiplier 513 on line 728 to turn the multiplier on.

The delay counter 727 generally keeps track of the needed offset delay for the PWM pulse. In addition to the start signal, the delay counter 727 inputs the calculated PWM offset for the new PWM pulse from multiplexer 509. The random number generator 503 outputs an 11 bit word (which is coupled by register 723 which is enabled by the first pulse and cleared by the output from exclusive OR gate 709 when the pulse protocol changes) for coupling to the multiplier 513 and the multiplexer 509. The multiplier 513 also accepts an 11 bit signal from the pulse inverter 507 representing the maximum possible offset to which a value of "1" from ones value generator 745 is added in adder 731 before being applied to the multiplier 513. It is a feature of the present invention that the addition of "1" assures the eventual (truncated) output of the multiplier to be a good rounded representation of the pseudorandom number multiplied by the maximum possible offset. A carry output is coupled to the multiplexer 509 to switch the multiplexer 509 when the maximum possible offset is the full width of the PWM period (all "1"s). In this case a multiply is unnecessary and the pseudorandom number is used as the output of the multiplier 521.

The delay counter 727 outputs an 11 bit bus to a count detector 733 which provides a binary output on line 734 when the count output from the delay counter equals "0". This output is coupled to the noninverting input of a AND gate 737.

The output from the duty cycle down counter 707 is output as an 11 bit bus to count detector 738 which detects an output from duty cycle down counter 707 equal to 0. Upon this occurrence, a binary signal is applied to the inverting input of AND gate 737 which is in turn coupled to exclusive—OR gate 711 for coupling as a PWM signal via register 739. A non-zero value in the down counter 707 causes a "1" to be output from the AND gate 737 (acting as a comparator). This signal is "enabled" by the output of detector 733 resulting in a non-polarized PWM pulse. The pulse is then polarized by the exclusive—OR gate 711 and the polarity (protocol) signal from 713 to create the final PWM pulse illustrated as PWM output waveform 603 in FIG. 6. Extra transitions are removed by inverter 710 and NAND 708 when the active low to active high protocol flips from one PWM period to another by disabling the PWM offset and setting it to zero for that one particular PWM pulse, as illustrated as PWM output waveform 613. Duty cycle counter 707 and delay counter 727 are implemented, in the preferred embodiment, as conventional 11 bit down counters.

Figure 8:
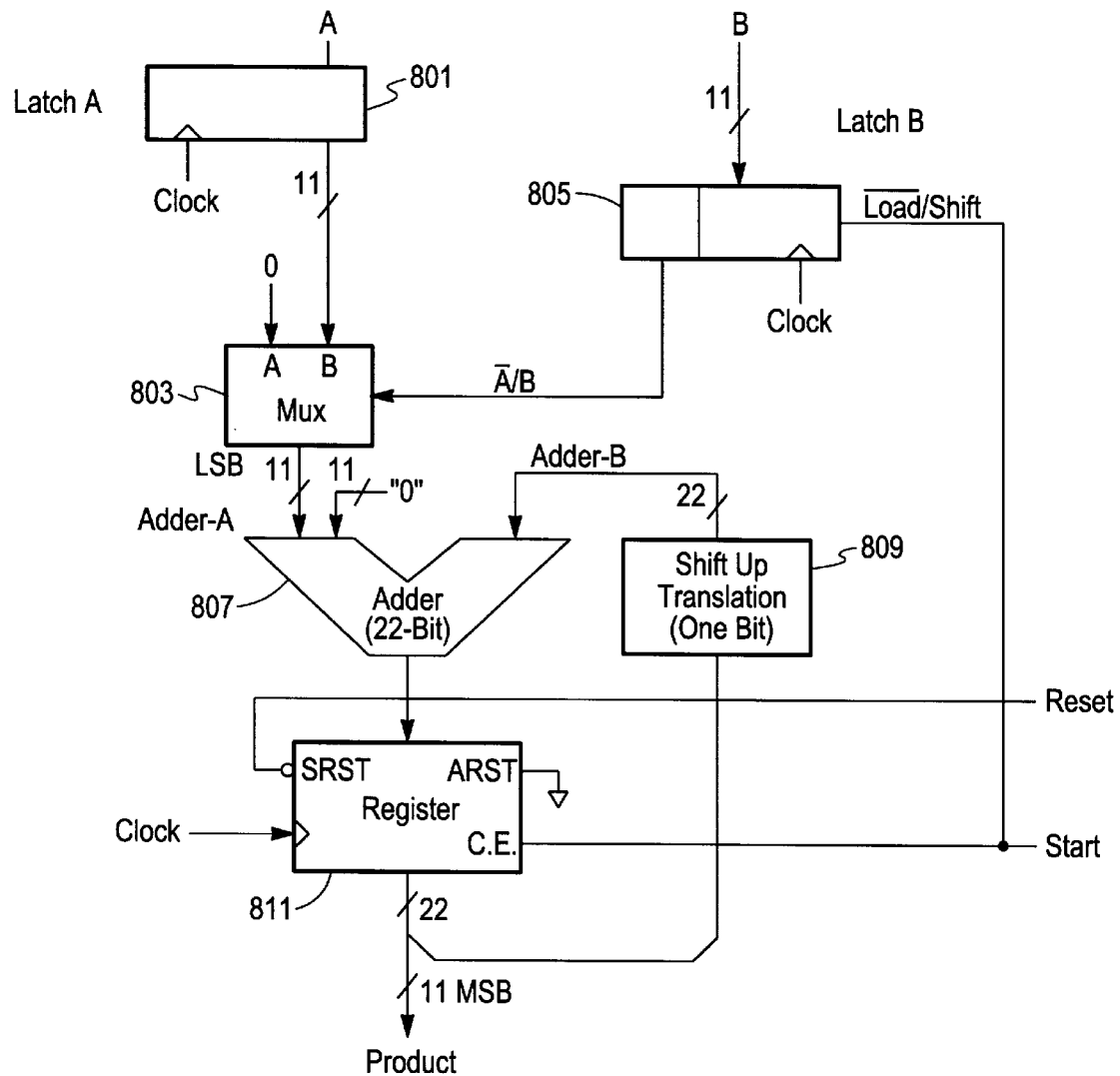
FIG. 8 is a detailed block diagram of a multiplier that may be employed in the pulse width modulator of FIGS. 7A and 7B.

Multiplier 513 is shown in further detail in FIG. 8. This multiplier is a typical "shift and add" multiplier, in which the input from the pulse inverter is considered to be an integer and the input from the pseudorandom generator is considered to be a fraction in the range of (0,1). The use of 11 of the 22 bits is a rounding function. Input A from the pseudorandom number generator 503 is first input to a latch 801 and coupled as an 11 bit wide number to multiplexer 803. The output of multiplexer 803, an 11 bit wide number, is determined by output by latch 805 which receives an 11 bit wide number from the pulse counter 507 as an input. The output from multiplexer 803 is input to 22 bit adder 807 where it is added to 22 bit wide number from the shift up translation 809. The 22 bit output from adder 807 is applied to register 811 and output to multiplexer 509 as an 11 bit number (the most significant bits of the 22 bit bus).

Figure 9:
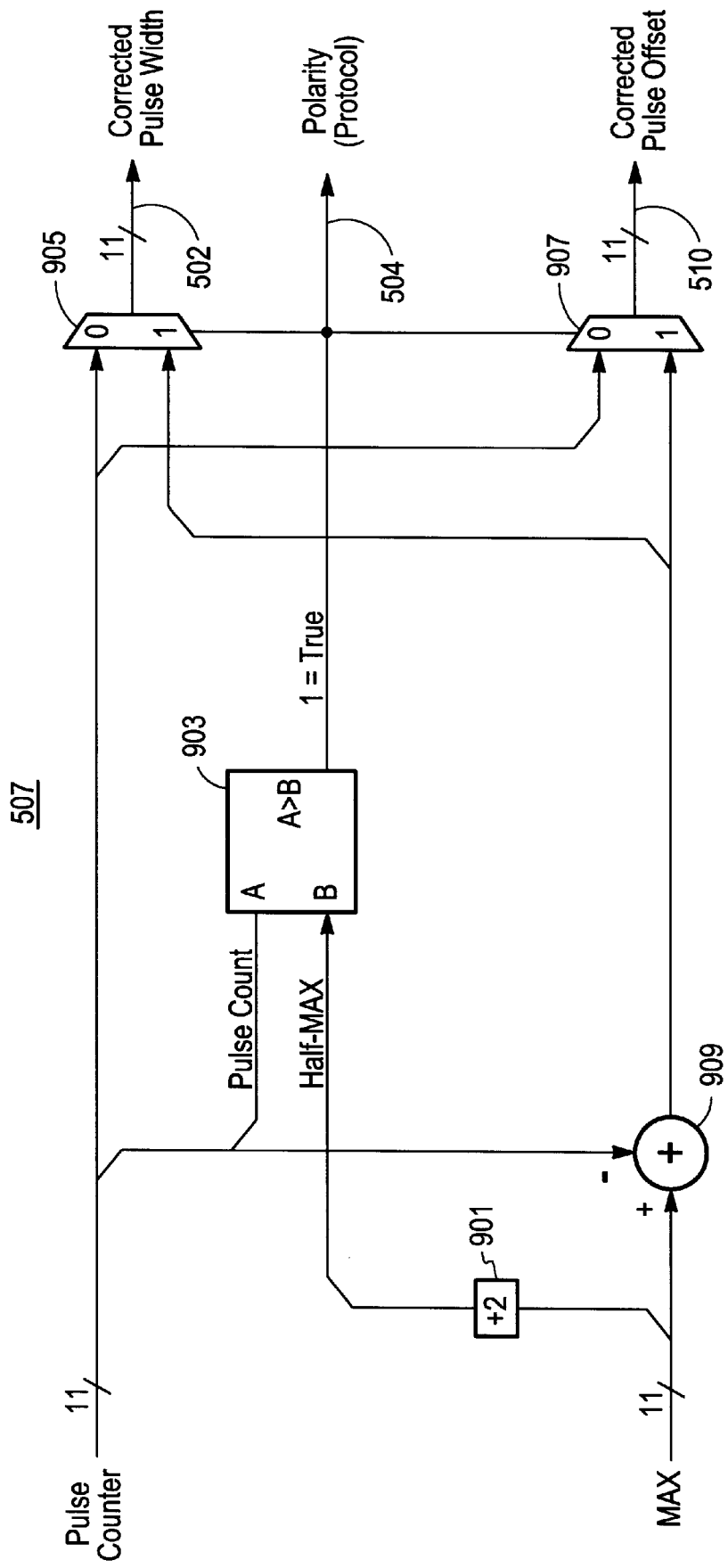
FIG. 9 is a detailed block diagram of a pulse inverter that may be employed in the pulse width modulator of FIGS. 7A and 7B.

A detailed diagram of the pulse inverter 507 is shown in FIG. 9. The input of the MAX signal is divided by two by shifting in divider 901 and applied to conventional 11 bit comparator 903 where it is compared to the 11 bit number from the pulse counter 501 to determine whether the current PWM output signal has a duty cycle of greater than 50%. Thus, when the 11 bit number from the pulse counter exceeds one-half the MAX signal, the comparator outputs a binary pulse indicating a reversal of active high to active low protocol will be needed. The pulse counter output signal is also applied to multiplexer 905 and multiplexer 907 which select between the pulse counter signal and the difference between the MAX signal and the pulse counter signal as generated by the 11 bit adder 909. Multiplexer 905 thus selects between the pulse counter 11 bit number and the difference between the MAX signal and the pulse counter number. The output values from the pulse inverter are considered corrected values.

Thus, a delta sigma modulator when coupled with a pulse width modulator provides a reduction in harmonic noise generation without the requirements for triangle or sawtooth analog signal generation. Reduction in the peak energy of the harmonic frequency generation has been shown to be about 10 dB compared to that of conventional pulse width modulation techniques.

I claim:

1. A control circuit for controlling power delivered to a load with reduced spurious electromagnetic energy generation, comprising:
    a delta sigma modulator accepting a first signal and generating a second signal representing said first signal with a plurality of digital pulses; and
    a pulse width modulator coupled to said delta sigma modulator, accumulating said second signal over a first time period, and generating a third signal coupled to the load and having a first magnitude value, said first magnitude value lasting for a second time period related to said second signal, said pulse width modulator further comprises:
        a pulse counter that multiplies each pulse of said plurality of digital pulses with a weight, said weight determined by position of each pulse relative to commencement of said first time period, thereby creating a plurality of weighted pulses, and said pulse counter accumulates said weighted pulses over said first time period,
        a low pass filter, coupled to said pulse counter, to generate a filtered bit stream, and
        a waveform generator, coupled to said low pass filter to generate, from said filtered bit stream, said third signal including a third time period greater than and encompassing said second time period.

2. The control circuit in accordance with claim 1 wherein, said delta sigma modulator further comprises a first order delta sigma modulator.

3. The control circuit in accordance with claim 1 wherein, said delta sigma modulator further comprises a second order delta sigma modulator.

4. The control circuit in accordance with claim 1 wherein, said delta sigma modulator further comprises a three stage cascaded delta sigma modulator.

5. A control circuit for controlling power delivered to a load with reduced spurious electromagnetic energy generation, comprising:
    a delta sigma modulator accepting a first signal and generating a second signal representing said first signal with a plurality of digital pulses thereby creating second signal pulses; and
    a pulse width modulator coupled to said delta sigma modulator, accumulating said second signal over a first time period, and generating a third signal coupled to the load and having a first magnitude value, said first magnitude value lasting for a second time period related to said second signal, said pulse width modulator further comprises:
        a pulse counter that multiplies each pulse of said plurality of digital pulses with a weight, said weight determined by position of each pulse relative to commencement of said first time period, thereby creating a plurality of weighted pulses, and said pulse counter accumulates said weighted pulses over said first time period,
        a low pass filter, coupled to said pulse counter, to generate a filtered bit stream,
        a waveform generator, coupled to said low pass filter to generate, from said filtered bit stream, said third signal including a third time period greater than and encompassing said second time period,
        a pulse width indicator to indicate when an accumulation of said second signal pulses create lasting for greater than 50% of said third time period, and a pulse protocol inverter coupled to said pulse width indicator to transform said third signal from an active high first magnitude value protocol to an active low first magnitude value protocol.

6. A control circuit in accordance with claim 5 further comprising:
    a delay generator coupled to said waveform generator and generating a time delay to offset a commencement of said second time period from a commencement of said third time period by a time equal to said time delay; and
    a delay generator disable coupled to said delay generator and said pulse protocol inverter for forcing said time delay to be zero time when said first time period has said active low first magnitude value protocol and is immediately followed by a following first period having said active high first magnitude value protocol, thereby reducing the number of transitions from said first magnitude value to a second magnitude value during said following first period.

7. A control circuit in accordance with claim 5 further comprising:
    a delay generator coupled to said waveform generator and generating a time delay to offset a commencement of said second time period from a commencement of said third time period by a time equal to said time delay; and
    a delay generator disable coupled to said delay generator and said pulse protocol inverter for forcing said time delay to be zero time when said first time period has said active high first magnitude value protocol and is immediately followed by a following first period having said active low first magnitude value protocol, thereby reducing the number of transitions from said first magnitude value to a second magnitude value during said following first period.

8. A control circuit in accordance with claim 5 further comprising:
   a delay generator coupled to said waveform generator and generating a time delay to offset a commencement of said second time period from a commencement of said third time period by a time equal to said time delay; and
   a delay generator disable coupled to said delay generator and said pulse protocol inverter for forcing said time delay to be zero time when said first time period has said active high first magnitude value protocol and is immediately followed by a following first period having said active low first magnitude value protocol and when said first time period has said active low first magnitude value protocol and is immediately followed by said following first period having said active high first magnitude value protocol, thereby reducing the number of transitions from said first magnitude value to a second magnitude value during said following first period.

9. A method of controlling power delivered to a load with reduced spurious electromagnetic energy generation, comprising the steps of:
   accepting a first signal input to a delta sigma modulator;
   generating a second signal representing said first signal with a plurality of digital pulses;
   accumulating said second signal over a first time period, further comprising the steps of:
      multiplying each pulse of said plurality of digital pulses with a weight, said weight determined by position of each pulse relative to the commencement of said first time period, thereby creating a plurality of weighted pulses,
      accumulating over said first time period said weighted pulses to generate an accumulated second signal,
      setting a third time period equal to said first time period, and
      generating, from said accumulated second signal, a third signal, said third signal including said third time period which is greater than and which encompasses a second time period; and coupling said third signal to the load and having a first magnitude value, said first magnitude value lasting for said second time period related to said second signal.

10. A method in accordance with the method of claim 9 further comprising the step of generating a time delay to offset a commencement of said second time period from a commencement of said third time period by a time equal to said time delay.

11. A method in accordance with the method of claim 10 further comprising the steps of:
   generating a fourth signal representing said third time period dividing by a factor of two, said forth signal to generate a halved fourth signal; and
   outputting a two state signal representing with a first state that said accumulated second signal is greater than said halved fourth signal, thereby indicating that said second time period exceeds 50% of said third time period, and representing with a second state that said accumulated second signal is less than said halved fourth signal, thereby indicating that said second time period does not exceed 50% of said third time period.

12. A method in accordance with the method of claim 11 further comprising the steps of:

subtracting said accumulated second signal from said fourth signal representing said third time period thereby generating a difference signal; and
receiving an indication when said second time period exceeds 50% of said third time period;
outputting said accumulated second signal as said difference signal upon said exceeding of 50%; and
outputting said difference signal as said accumulated second signal upon said exceeding of 50%.

13. A method of controlling power delivered to a load with reduced spurious electromagnetic energy generation, comprising the steps of:
   accepting a first signal input to a delta sigma modulator;
   generating a second signal representing said first signal with a plurality of digital pulses;
   accumulating said second signal over a first time period, further comprises the steps of:
      multiplying each pulse of said plurality of digital pulses with a weight, said weight determined by position of each pulse relative to the commencement of said first time period, thereby creating a plurality of weighted pulses;
      accumulating over said first time period said weighted pulses;
      generating a second time period related to said second signal;
      setting a third time period equal to said first time period;
      generating, from the accumulated number of weighted pulses, a third signal, said third signal including said third time period which is greater than and which encompasses said second time period, said third signal having a first magnitude value, said first magnitude value lasting for said second time period;
      indicating when the accumulated number of weighted pulses create said second time period lasting for greater than 50% of said third time period;
      receiving an indication when said second time period exceeds 50% of said third time period;
      transforming said third signal from an active high first magnitude value protocol to an active low first magnitude value protocol upon receiving said indication; and
   coupling said third signal to the load.

14. A method in accordance with the method of claim 13 further comprising the steps of:
   generating a time delay to offset a commencement of said second time period from a commencement of said third time period by a time equal to said time delay; and
   forcing said time delay to be zero time when said first time period has said active low first magnitude value protocol and is immediately followed by a following first period having said active high first magnitude value protocol, thereby reducing the number of transitions from said first magnitude value to a second magnitude value during said following first period.

15. A method in accordance with the method of claim 13 further comprising the steps of:
   generating a time delay to offset a commencement of said second time period from a commencement of said third time period by a time equal to said time delay; and
   forcing said time delay to be zero time when said first time period has said active high first magnitude value protocol and is immediately followed by a following first period having said active low first magnitude value protocol, thereby reducing the number of transitions from said first magnitude value to a second magnitude value during said following first period.

16. A method in accordance with the method of claim 13 further comprising the steps of:

generating a time delay to offset a commencement of said second time period from a commencement of said third time period by a time equal to said time delay; and forcing said time delay to be zero time when said first time period has said active low first magnitude value protocol and is immediately followed by a following first period having said active high first magnitude value protocol and when said first time period has said active high first magnitude value protocol and is immediately followed by said following first period having said active low first magnitude value protocol, thereby reducing the number of transitions from said first magnitude value to a second magnitude value during said following first period.

* * * * *

UNITED STATES PATENT AND TRADEMARK OFFICE
CERTIFICATE OF CORRECTION

PATENT NO. : 5,901,176
DATED : May 4, 1999
INVENTOR(S) : Lewison

It is certified that error appears in the above-identified patent and that said Letters Patent is hereby corrected as shown below:

Column 9,
Lines 51 and 66, before "comprises", delete "further".

Column 10,
Lines 2, 5 and 20, before "comprises", delete "further".
Line 35, before "lasting", insert -- said second time period --.

Signed and Sealed this

Twenty-first Day of October, 2003

JAMES E. ROGAN
*Director of the United States Patent and Trademark Office*